(12) United States Patent
Lee (10) Patent No.: US 9,120,170 B2
(45) Date of Patent: Sep. 1, 2015

(54) APPARATUS AND METHOD FOR PLACING AND MOUNTING SOLDER BALLS ON AN INTEGRATED CIRCUIT SUBSTRATE

(71) Applicant: Zen Voice Corporation, Sinfong Township, Hsinchu County (TW)

(72) Inventor: Tu-Chen Lee, Sinfong Township (TW)

(73) Assignee: Zen Voce Corporation, Sinfong Township (TW)

( * ) Notice: Subject to any disclaimer, the term of this patent is extended or adjusted under 35 U.S.C. 154(b) by 0 days.

(21) Appl. No.: 14/069,453

(22) Filed: Nov. 1, 2013

(65) Prior Publication Data

US 2015/0122873 A1    May 7, 2015

(51) Int. Cl.
*B23K 31/02* (2006.01)
*B23K 3/06* (2006.01)
*H01L 23/00* (2006.01)

(52) U.S. Cl.
CPC ............ *B23K 3/0623* (2013.01); *H01L 24/742* (2013.01)

(58) Field of Classification Search
None
See application file for complete search history.

(56) References Cited

U.S. PATENT DOCUMENTS

| | | | | |
|---|---|---|---|---|
| 4,871,110 A | * | 10/1989 | Fukasawa et al. | 228/245 |
| 5,551,216 A | * | 9/1996 | McGill | 53/473 |
| 5,782,399 A | * | 7/1998 | Lapastora | 228/41 |
| 5,941,449 A | * | 8/1999 | Le Coz et al. | 228/248.1 |
| 5,976,965 A | * | 11/1999 | Takahashi et al. | 438/616 |
| 6,030,889 A | * | 2/2000 | Aulicino et al. | 438/613 |
| 6,041,996 A | * | 3/2000 | Arikado | 228/180.22 |
| 6,056,190 A | * | 5/2000 | Foulke et al. | 228/246 |
| 6,065,201 A | * | 5/2000 | Sakai | 29/430 |
| 6,234,382 B1 | * | 5/2001 | Rischke et al. | 228/245 |
| 6,253,992 B1 | * | 7/2001 | Fjelstad | 228/245 |
| 6,276,598 B1 | * | 8/2001 | Cheng et al. | 228/245 |
| 6,390,351 B1 | * | 5/2002 | Kasai et al. | 228/41 |
| 6,422,452 B2 | * | 7/2002 | Yamamoto et al. | 228/246 |
| 6,533,159 B1 | * | 3/2003 | Cobbley et al. | 228/20.1 |
| 6,533,160 B1 | * | 3/2003 | Bourrieres et al. | 228/41 |
| 6,551,863 B2 | * | 4/2003 | Johnson et al. | 438/127 |
| 6,604,673 B1 | * | 8/2003 | Bourrieres et al. | 228/246 |
| 7,100,813 B2 | * | 9/2006 | Bayot | 228/43 |
| 7,726,546 B2 | * | 6/2010 | Maeda | 228/180.22 |
| 2002/0058406 A1 | * | 5/2002 | Mukuno et al. | 438/626 |
| 2003/0111508 A1 | * | 6/2003 | Cobbley et al. | 228/41 |

(Continued)

FOREIGN PATENT DOCUMENTS

| | | | | | |
|---|---|---|---|---|---|
| JP | 08236916 A | * | 9/1996 | | H05K 3/34 |
| JP | 10041341 A | * | 2/1998 | | |

(Continued)

*Primary Examiner* — Kiley Stoner
(74) *Attorney, Agent, or Firm* — Alan D. Kamrath; Kamrath IP Lawfirm, P.A.

(57) ABSTRACT

An apparatus for placing and mounting solder balls on an integrated circuit substrate contains: a fixture, a vacuuming device, a guiding plate, and a storage tank. The fixture includes a plurality of first grooves defined therein, the vacuuming device is disposed over the fixture and includes a vacuum chamber which has an air pore so that when air is drawn out of the vacuum chamber via the air pore, a plurality of solder balls are attached, and when the air is fed into the vacuum chamber from the air pore, the plurality of solder balls are released. The guiding plate is secured below the fixture, and the storage tank is arranged below the guiding plate and is applied to accommodate the plurality of solder balls. Thereby, a production yield of placing and mounting the plurality of solder balls on an integrated circuit substrate is enhanced.

1 Claim, 14 Drawing Sheets

(56) References Cited

U.S. PATENT DOCUMENTS

| | | | |
|---|---|---|---|
| 2003/0127501 A1* | 7/2003 | Cheng et al. | 228/246 |
| 2004/0183186 A1* | 9/2004 | Hirose | 257/690 |
| 2006/0169743 A1* | 8/2006 | Ng et al. | 228/39 |
| 2006/0231200 A1* | 10/2006 | Niizuma | 156/285 |
| 2007/0111500 A1* | 5/2007 | Cowens et al. | 438/612 |
| 2007/0130764 A1* | 6/2007 | Nebashi et al. | 29/843 |
| 2008/0176393 A1* | 7/2008 | Mackay | 438/613 |
| 2009/0056977 A1* | 3/2009 | Shoji et al. | 174/250 |
| 2010/0123257 A1* | 5/2010 | Liu | 257/777 |
| 2011/0092066 A1* | 4/2011 | Mackay | 438/616 |
| 2012/0085810 A1* | 4/2012 | Lee | 228/41 |
| 2012/0292377 A1* | 11/2012 | Shoji et al. | 228/248.1 |
| 2014/0339291 A1* | 11/2014 | Chen et al. | 228/248.1 |

FOREIGN PATENT DOCUMENTS

| | | | |
|---|---|---|---|
| JP | 10041342 A | * | 2/1998 |
| JP | 2002-084061 A | * | 3/2002 |

* cited by examiner

APPARATUS AND METHOD FOR PLACING AND MOUNTING SOLDER BALLS ON AN INTEGRATED CIRCUIT SUBSTRATE

FIELD OF THE INVENTION

The present invent relates to an apparatus and a method for placing and mounting solder balls on an integrated circuit substrate which prevent a plurality of solder balls from being scraped so as to enhances production yield.

BACKGROUND OF THE INVENTION

A conventional method for mounting solder balls on an integrated circuit substrate contains: a first fixture including a plurality of grooves, and each groove has an upper opening and a lower opening smaller than the upper opening and is served to receive a solder ball. A through hole is defined below a respective one of the plurality of grooves, and a vacuuming device is fixed below the first fixture and includes a vacuuming device formed therein and having a plurality of connecting orifices for corresponding to a plurality of through holes of the first fixture, the vacuuming chamber also has an air pore defined on a central portion thereof so that when air is drawn out of the vacuum chamber via the air pore, a plurality of solder balls are attached, and when air is fed into the vacuum chamber from the air pore, the plurality of solder balls are released. A turning assembly is mounted on two side of the vacuuming device so as to rotate the first fixture 180 degrees. A guiding plate is disposed below the first fixture and includes a plurality of apertures for corresponding to the plurality of grooves of the first fixture, each aperture is provided to hold the solder ball. A second fixture is secured above the guiding plate and is applied to accommodate the plurality of solder balls. In operation, the guiding plate is descended to connect with the first fixture, and the turning device rotates the first fixture and the guiding plate so that the second fixture moves back and forth on the guiding plate, hence the plurality of solder balls are placed into the plurality of grooves of the first fixture via the plurality of apertures of the guiding plate, and then the vacuuming device draws air out of the vacuum chamber through the air pore so that the plurality of solder balls are attached. Thereafter, the guiding plate is lifted to move away from the first fixture on the first fixture, and the turning device downwardly rotate the first fixture 180 degrees so that the plurality of solder balls on the first fixture face downwardly. A substrate is lifted, and air is fed into the vacuum chamber from the air pore so that the plurality of solder balls are released from the first fixture and are mounted onto a flux of the substrate, and then the substrate is moved downwardly, thereby finishing a ball mounting process.

However, a gap between the second fixture and the guiding plate cannot be controlled exactly, so such a conventional method is only applicable for each solder ball with more than 0.25 mm of size, and the plurality of solder balls are scraped easily in a ball placing process.

The present invention has arisen to mitigate and/or obviate the afore-described disadvantages.

SUMMARY OF THE INVENTION

The primary object of the present invention is to provide an apparatus and a method for placing and mounting solder balls on an integrated circuit substrate which prevent a plurality of solder balls from being scraped so as to enhance production yield.

To obtain the above objective, an apparatus for placing and mounting solder balls on an integrated circuit substrate comprising: a fixture, a vacuuming device, a guiding plate, and a storage tank.

The fixture includes a plurality of first grooves defined therein, and each first groove has an upper opening and a lower opening, a diameter of the upper opening is less than that of the lower opening, and each first groove is provided to receive a respective one of a plurality of solder balls, and the fixture also includes a plurality of through holes formed therein and located on the plurality of first grooves.

The vacuuming device is disposed over the fixture and includes a vacuum chamber arranged therein and having a plurality of connecting orifices for corresponding to the plurality of through holes of the fixture, the vacuum chamber has an air pore defined on a central portion thereof so that when air is drawn out of the vacuum chamber via the air pore, the plurality of solder balls are attached, and when the air is fed into the vacuum chamber from the air pore, the plurality of solder balls are released, the vacuuming device includes a turning assembly fixed on two sides thereof so as to leftward or rightward rotate the fixture, the vacuuming device, the guiding plate, and the storage tank over 180 degrees.

The guiding plate is secured below the fixture and includes a plurality of apertures for corresponding to the plurality of first grooves of the fixture, and each aperture is used to receive the respective one of the plurality of solder balls, the guiding plate also includes a plurality of second grooves defined therein and communicating with the plurality of apertures, and a diameter of a lower opening of each second groove is greater than that of each aperture.

The storage tank is arranged below the guiding plate and is applied to accommodate the plurality of solder balls.

In addition, a method for placing and mounting solder balls on an integrated circuit substrate comprises steps of:

A. lifting a guiding plate and a storage tank upwardly to connect with a fixture;
B. rotating a turning assembly counterclockwisely, after the guiding plate and the storage tank are connected with the fixture;
C. drawing air out of the vacuum chamber via an air pore by means of a vacuuming device so as to attach a plurality of solder balls, when the turning assembly rotates counterclockwisely, wherein after the turning assembly rotates counterclockwisely over 180 degrees, the plurality of solder balls in the storage tank move leftward;
D. rotating the turning assembly clockwisely after the plurality of solder balls in the storage tank move leftward;
E. moving the plurality of solder balls in storage tank rightward after the turning assembly rotates clockwisely over 180 degrees;
F. placing the plurality of solder balls into a plurality of apertures of the guiding plate from the storage tank again and rotating the storage tank, the guiding plate, the vacuuming device, and the fixture back to an original angle;
G. moving the guiding plate and the storage tank downwardly so that the guiding plate and the storage tank disconnect from the fixture;
H. horizontally moving the guiding plate and the storage to one side;
I. lifting a substrate;
J. starting to mount the plurality of solder balls;
K. re-feeding air into the vacuum chamber from the air pore of the vacuuming device so as to release the plurality of solder balls onto a flux of the substrate from the fixture;
L. descending the substrate on which the plurality of solder balls are mounted.

DETAILED DESCRIPTION OF THE PREFERRED EMBODIMENTS

Figure 1:
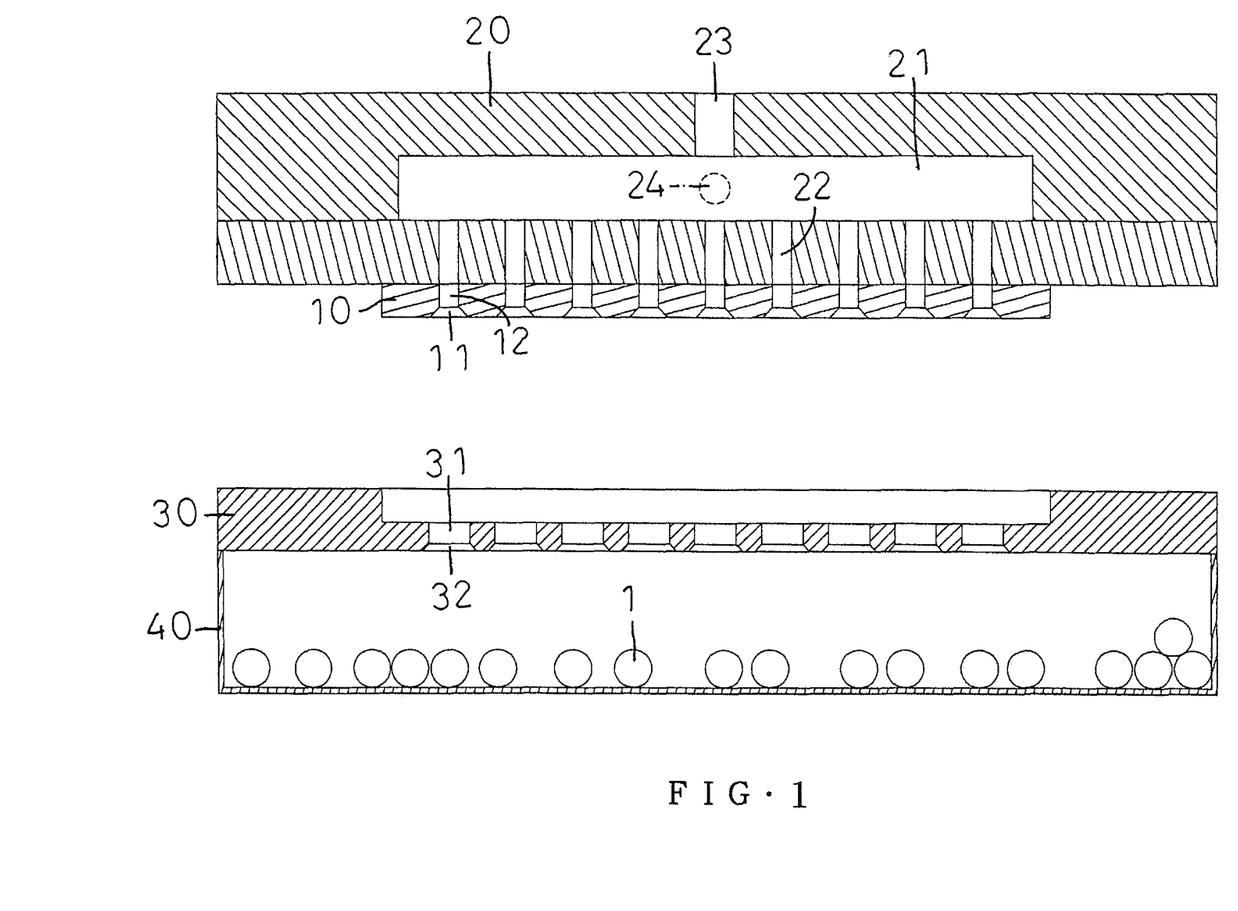
FIG. 1 is a cross sectional view showing the assembly of an apparatus for placing and mounting solder balls on an integrated circuit substrate according to a preferred embodiment of the present invention.

With reference to FIG. 1, an apparatus for placing and mounting solder balls on an integrated circuit substrate according to a preferred embodiment of the present invention comprises: a fixture 10, a vacuuming device 20, a guiding plate 30, and a storage tank 40.

The fixture 10 includes a plurality of first grooves 11 defined therein, and each first groove 11 has an upper opening and a lower opening, wherein a diameter of the upper opening is less than that of the lower opening, and each first groove 11 is provided to receive a respective one of a plurality of solder balls 1, and the fixture 10 also includes a plurality of through holes 12 formed therein and located on the plurality of first grooves 11.

The vacuuming device 20 is disposed over the fixture 10 and includes a vacuum chamber 21 arranged therein and having a plurality of connecting orifices 22 for corresponding to the plurality of through holes 12 of the fixture 10, the vacuum chamber 21 has an air pore 23 defined on a central portion thereof so that when air is drawn out of the vacuum chamber 21 via the air pore 23, the plurality of solder balls 1 are attached, and when the air is fed into the vacuum chamber 21 from the air pore 23, the plurality of solder balls 1 are released. The vacuuming device 20 includes a turning assembly 24 fixed on two sides thereof so as to leftward or rightward rotate the fixture 10, the vacuuming device 20, the guiding plate 30, and the storage tank 40 over 180 degrees.

The guiding plate 30 is secured below the fixture 10 and includes a plurality of apertures 31 for corresponding to the plurality of first grooves 11 of the fixture 10, and each aperture 31 is used to receive the respective one of the plurality of solder balls 1. The guiding plate 30 also includes a plurality of second grooves 32 defined therein and communicating with the plurality of apertures 31, and wherein a diameter of a lower opening of each second groove 32 is greater than that of each aperture 31.

The storage tank 40 is arranged below the guiding plate 30 and is applied to accommodate the plurality of solder balls 1.

Figure 2:
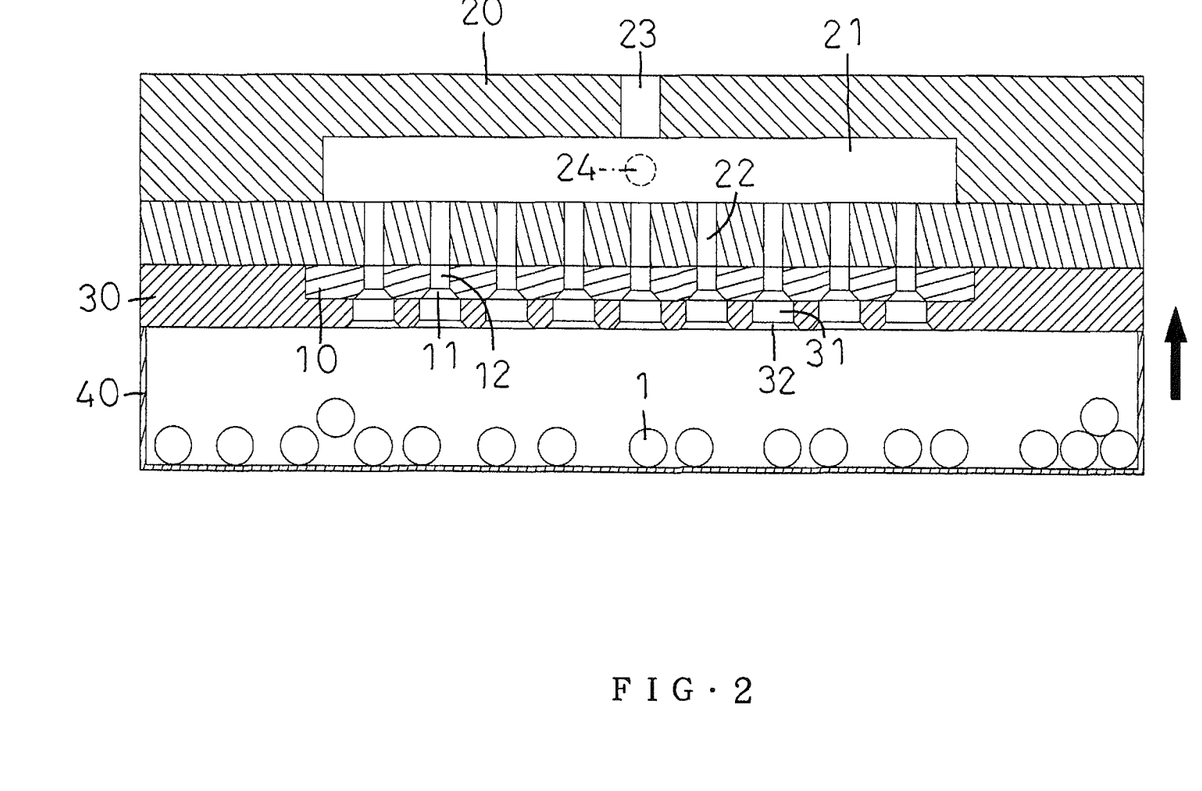
FIG. 2 is a cross sectional view showing the operation of step A of a method for placing and mounting solder balls on an integrated circuit substrate according to a preferred embodiment of the present invention.
Figure 3:
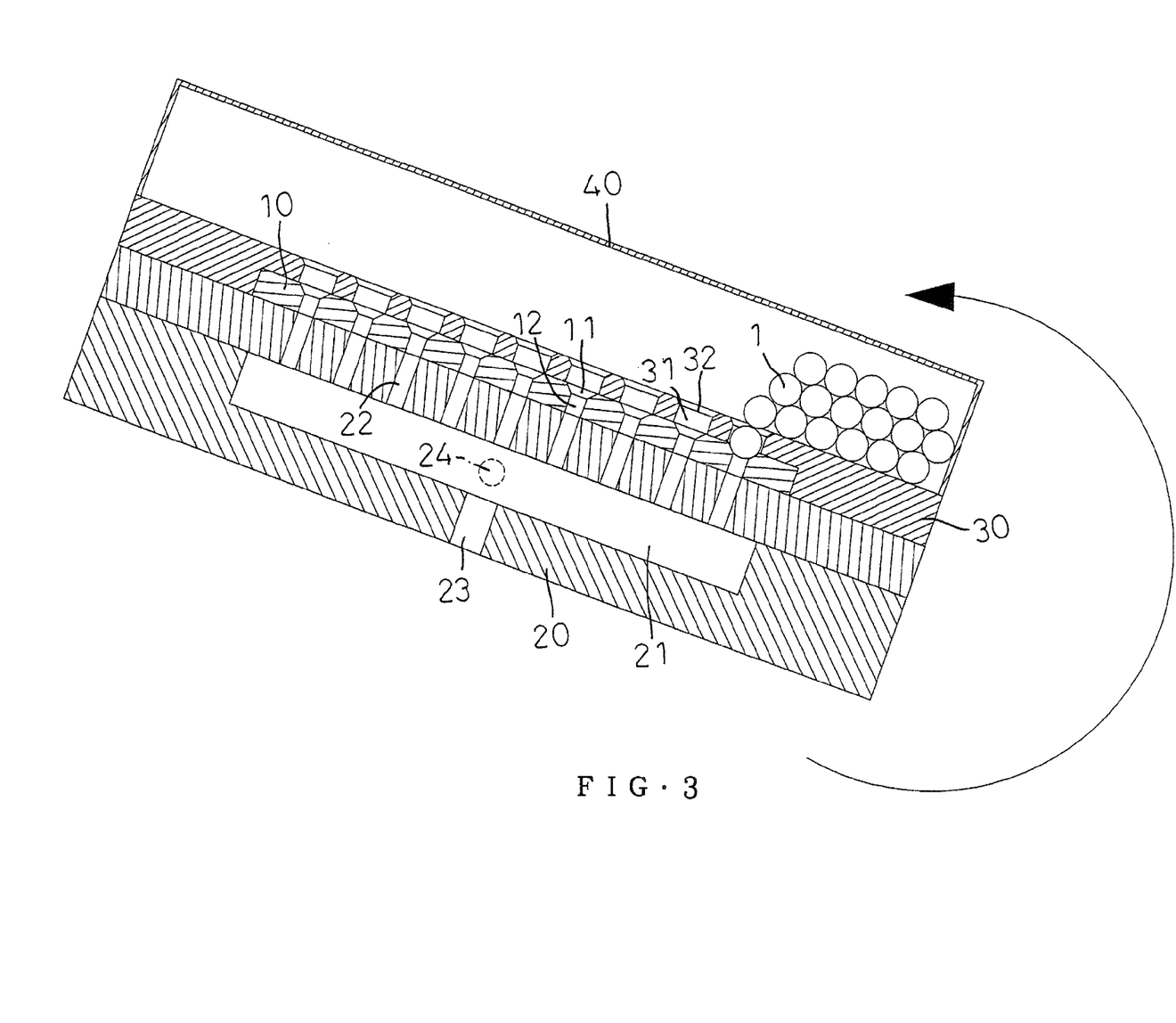
FIG. 3 is a cross sectional view showing the operation of step B of the method for placing and mounting solder balls on an integrated circuit substrate according to the preferred embodiment of the present invention.
Figure 4:
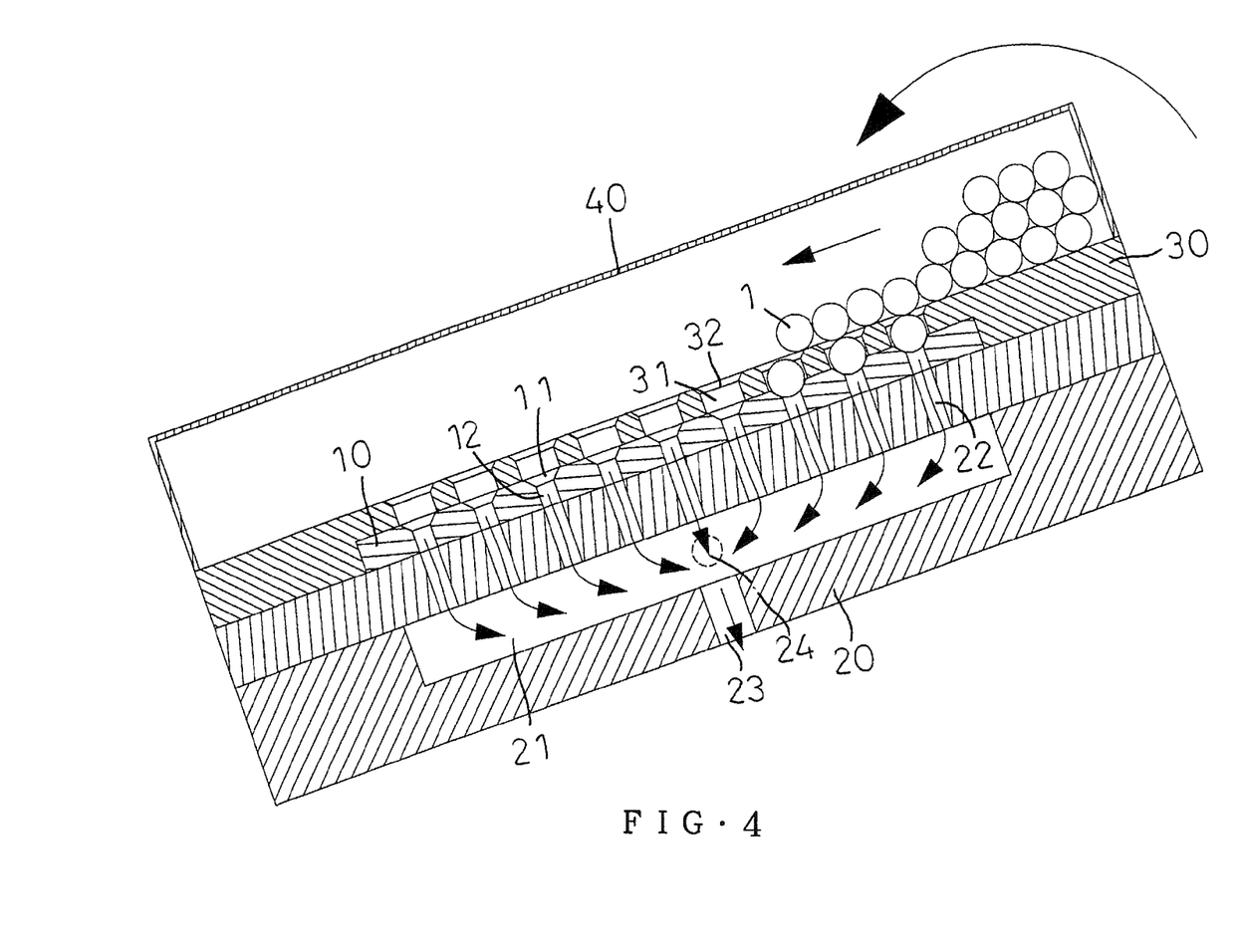
FIG. 4 is a cross sectional view showing the operation of step C of the method for placing and mounting solder balls on an integrated circuit substrate according to the preferred embodiment of the present invention.
Figure 5:
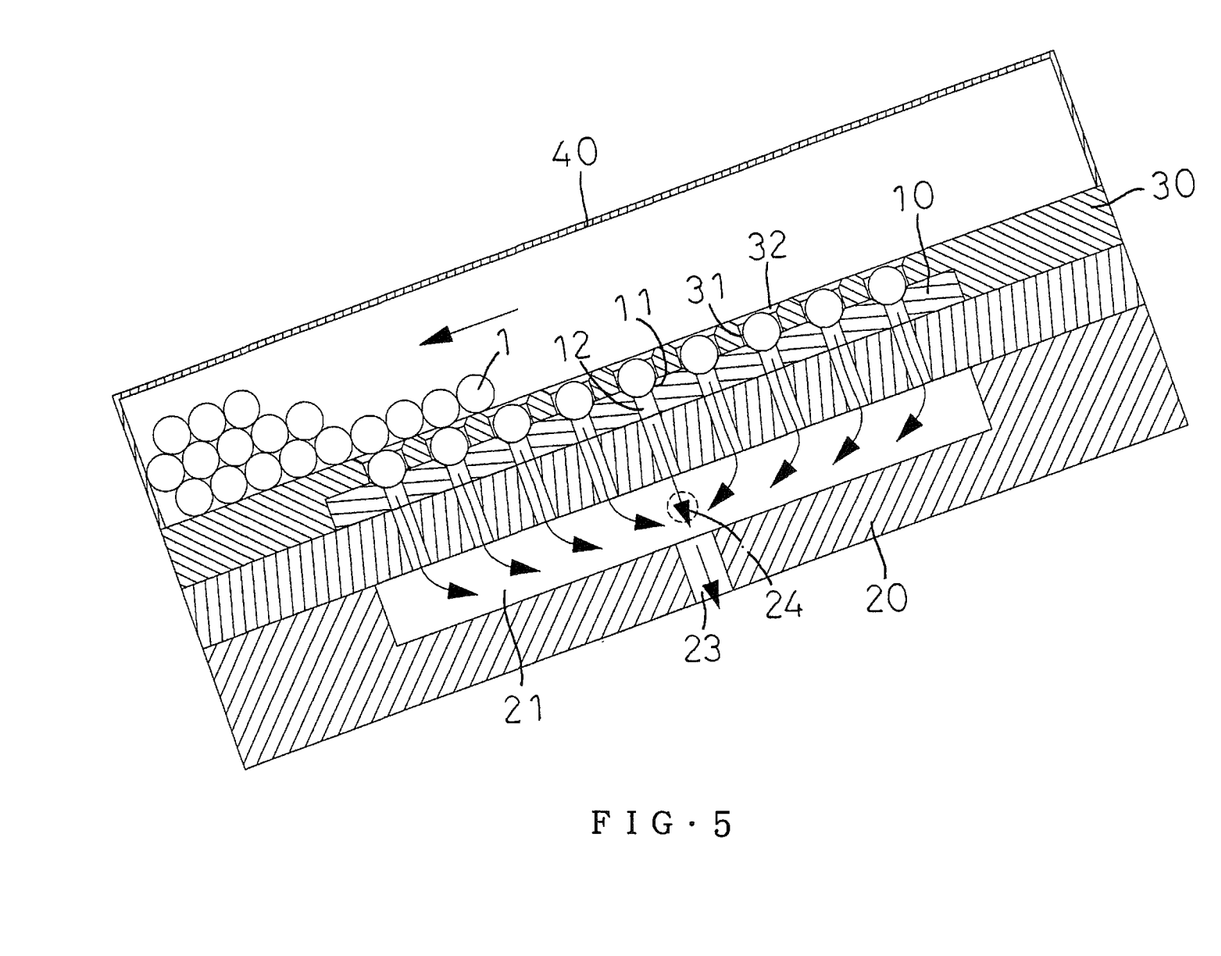
FIG. 5 is a cross sectional view showing after the turning assembly rotates counterclockwisely over 180 degrees, a plurality of solder balls in the storage tank move leftward.
Figure 6:
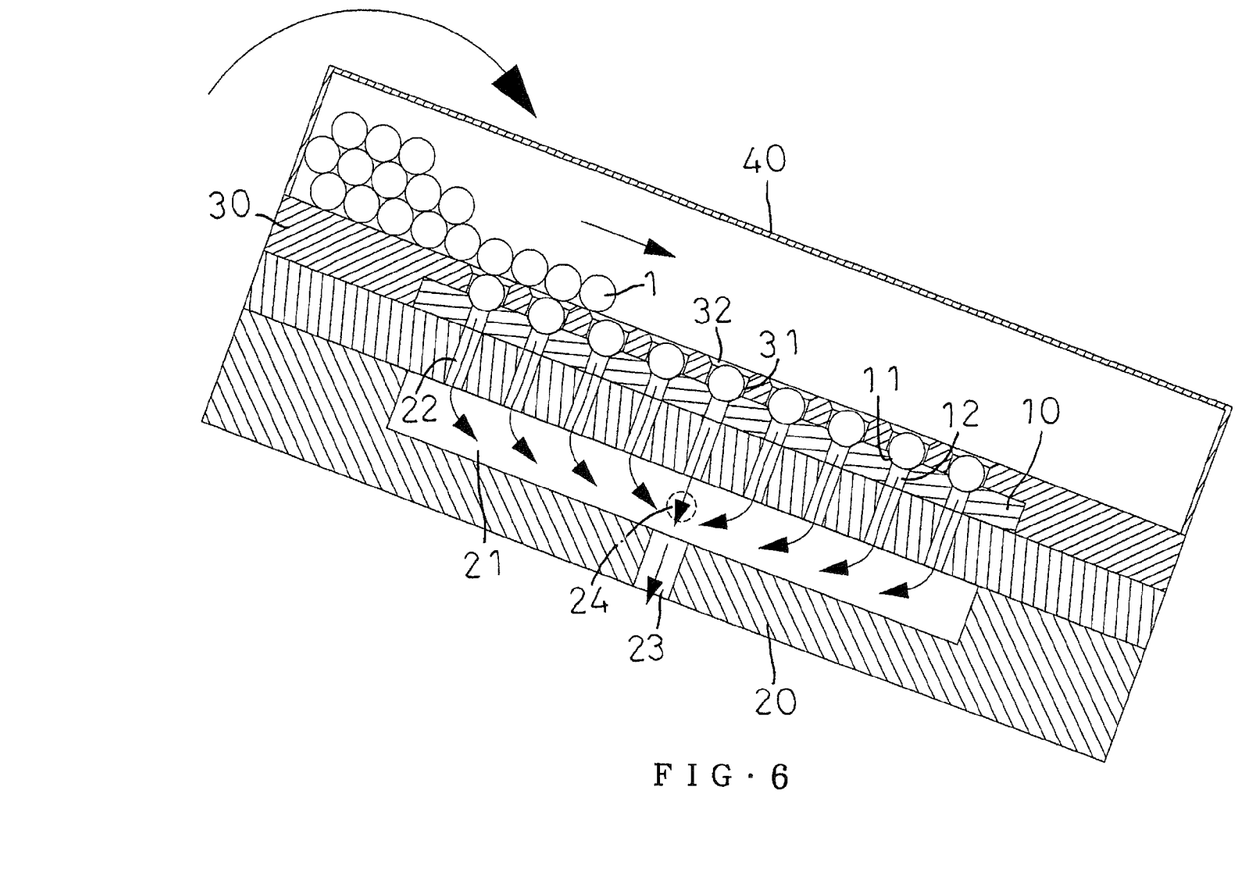
FIG. 6 is a cross sectional view showing the operation of step D of the method for placing and mounting solder balls on an integrated circuit substrate according to the preferred embodiment of the present invention.
Figure 7:
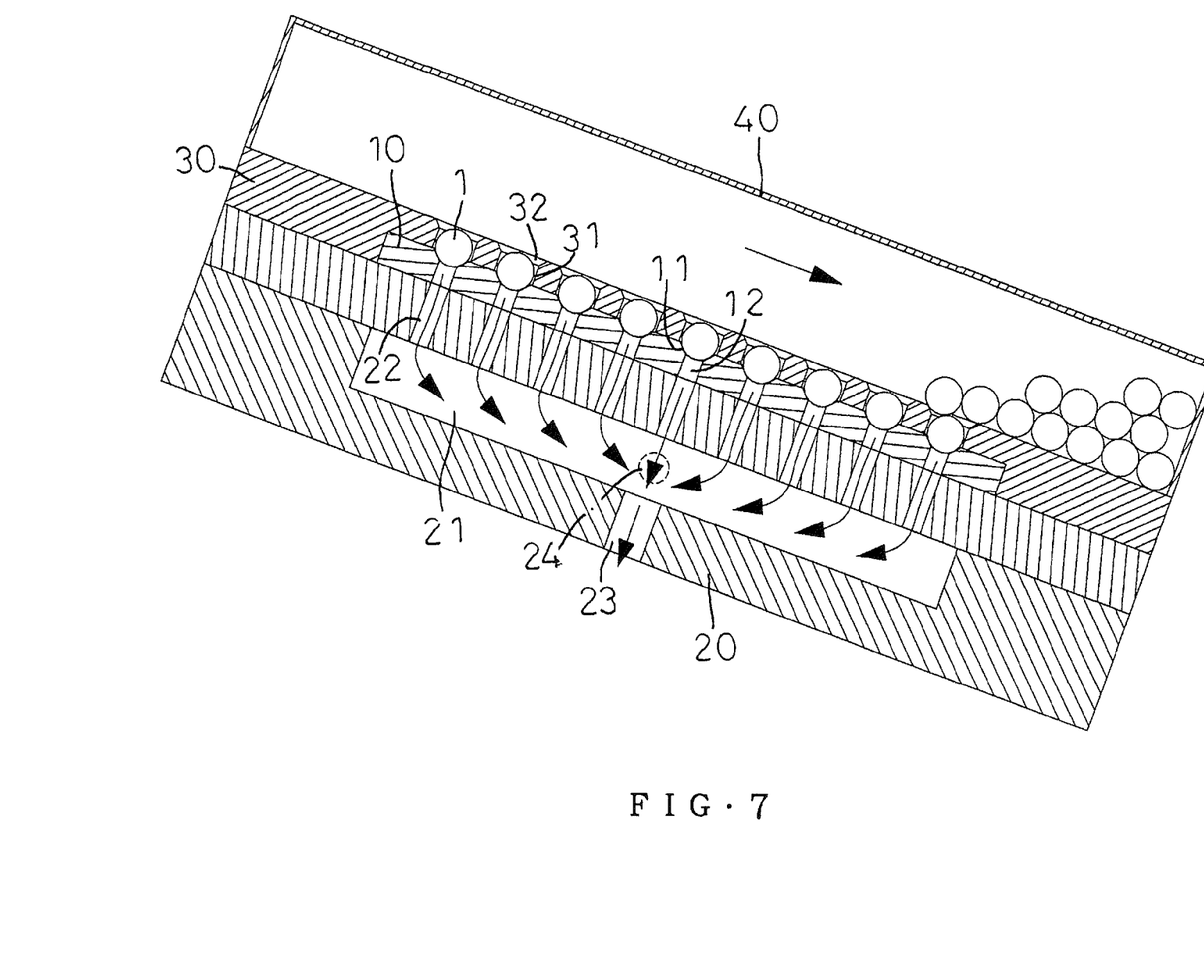
FIG. 7 is a cross sectional view showing the operation of step E of the method for placing and mounting solder balls on an integrated circuit substrate according to the preferred embodiment of the present invention.
Figure 8:
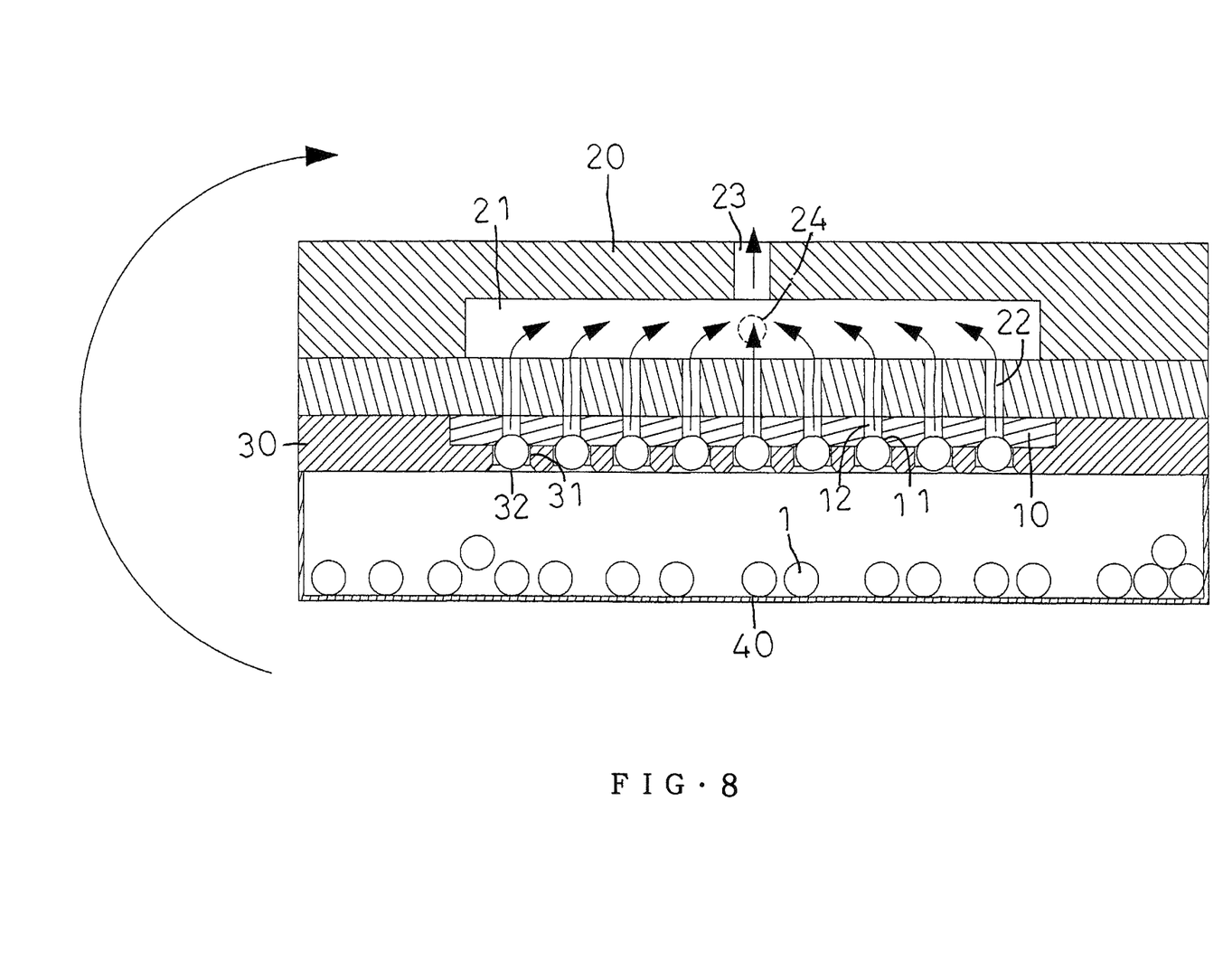
FIG. 8 is a cross sectional view showing the operation of step F of the method for placing and mounting solder balls on an integrated circuit substrate according to the preferred embodiment of the present invention.
Figure 9:
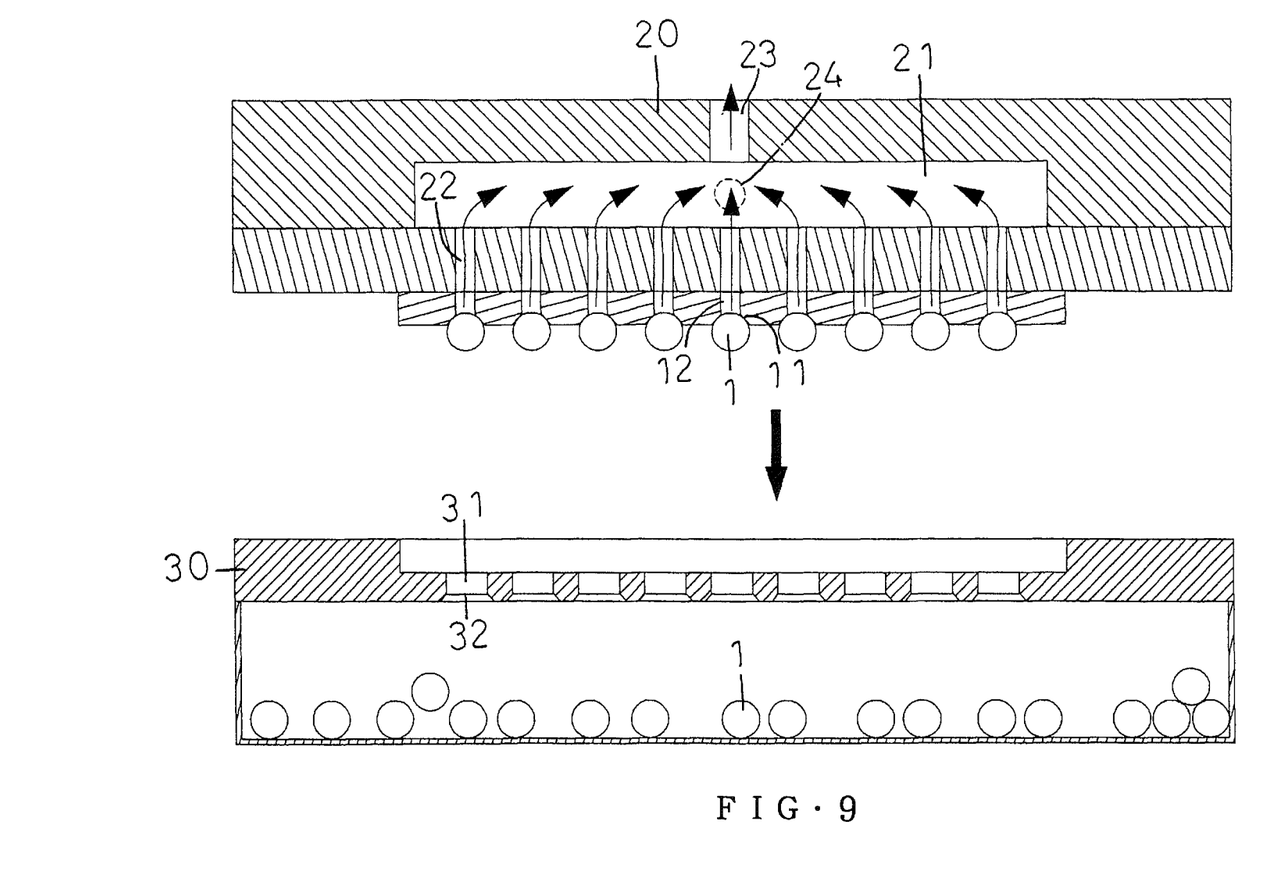
FIG. 9 is a cross sectional view showing the operation of step G of the method for placing and mounting solder balls on an integrated circuit substrate according to the preferred embodiment of the present invention.
Figure 10:
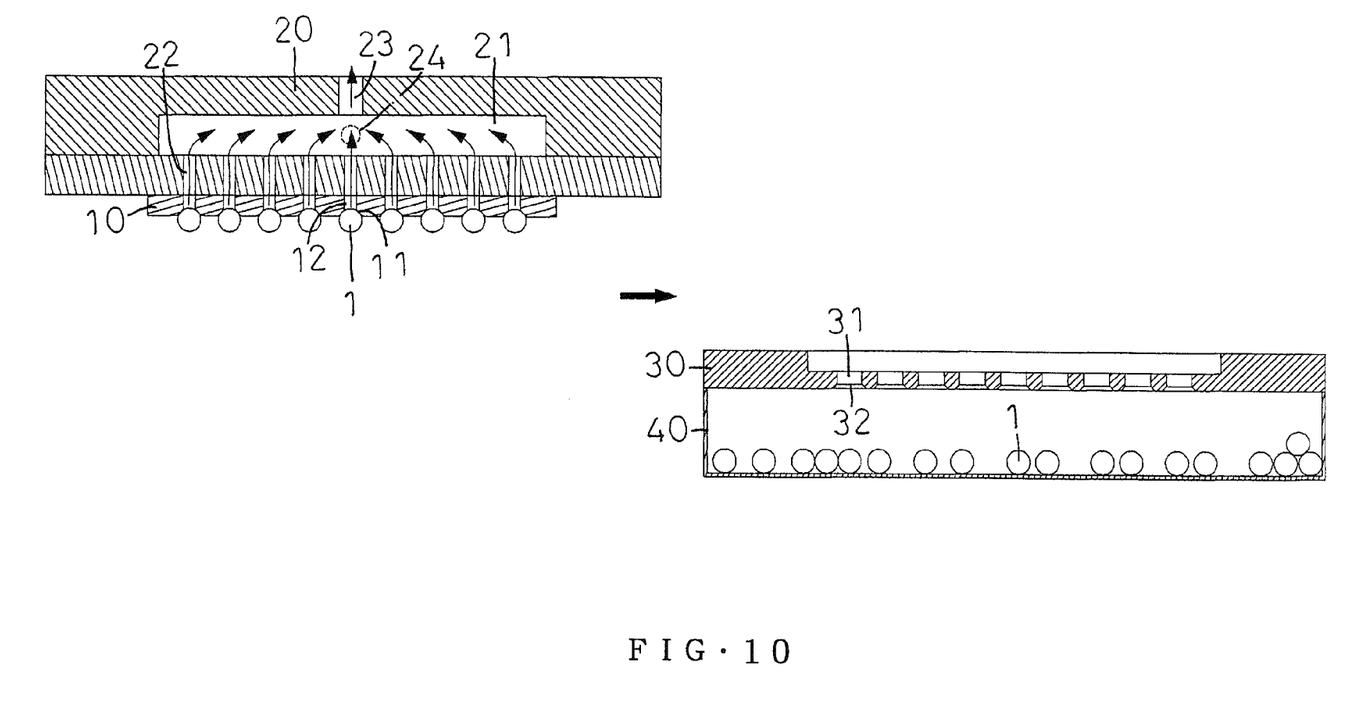
FIG. 10 is a cross sectional view showing the operation of step H of the method for placing and mounting solder balls on an integrated circuit substrate according to the preferred embodiment of the present invention.
Figure 11:
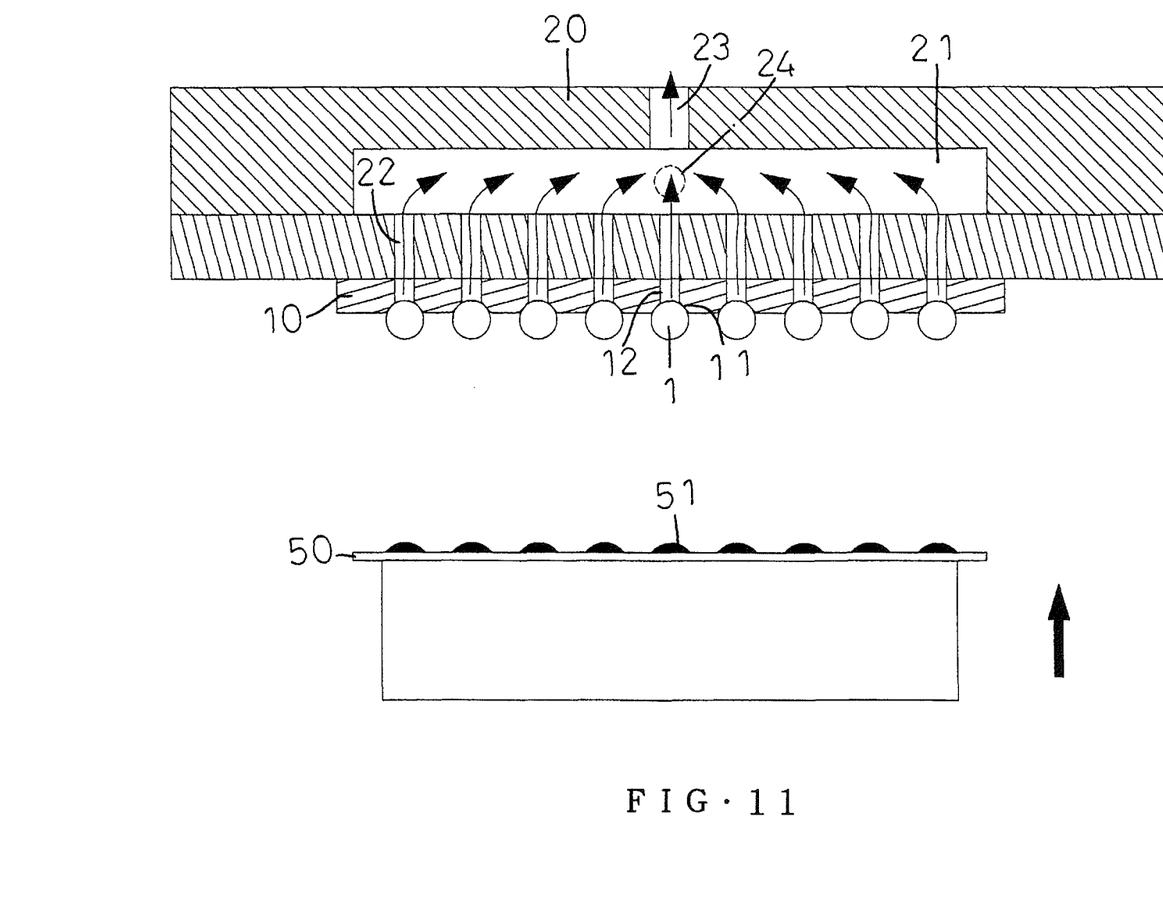
FIG. 11 is a cross sectional view showing the operation of step I of the method for placing and mounting solder balls on an integrated circuit substrate according to the preferred embodiment of the present invention.
Figure 12:
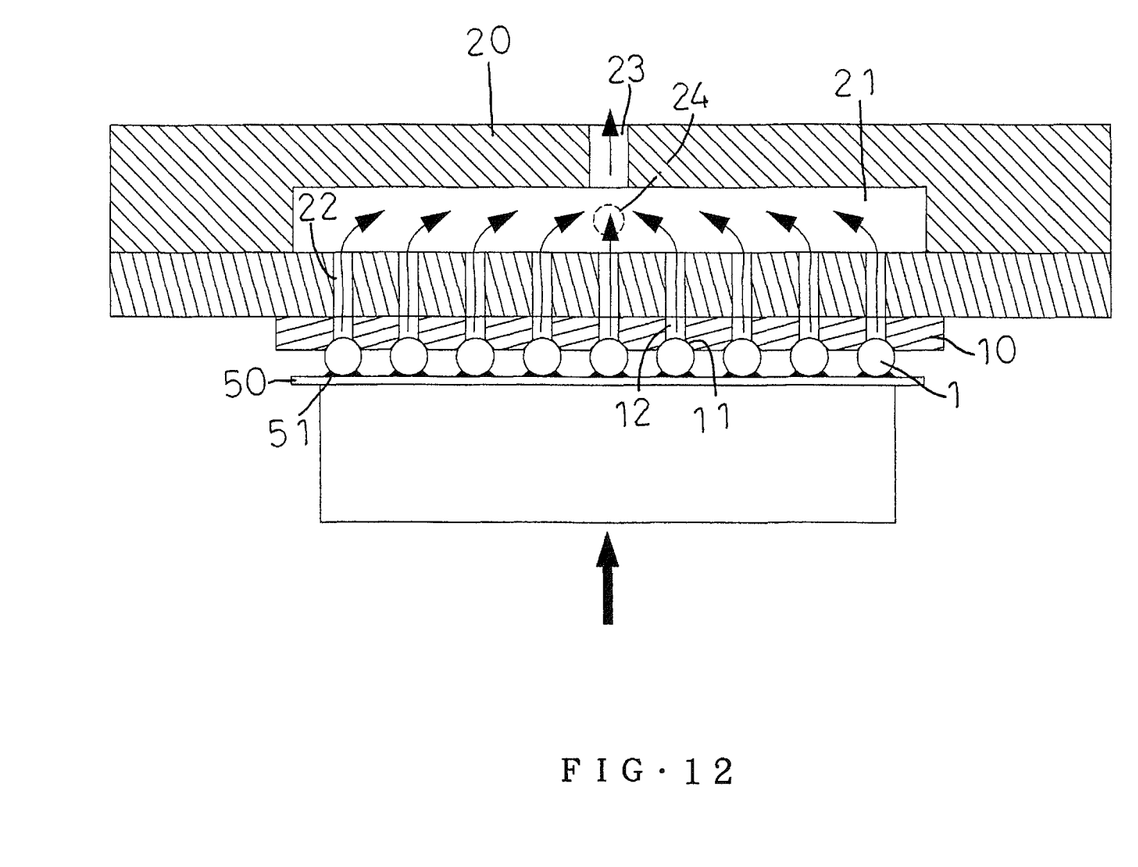
FIG. 12 is a cross sectional view showing the operation of step J of the method for placing and mounting solder balls on an integrated circuit substrate according to the preferred embodiment of the present invention.
Figure 13:
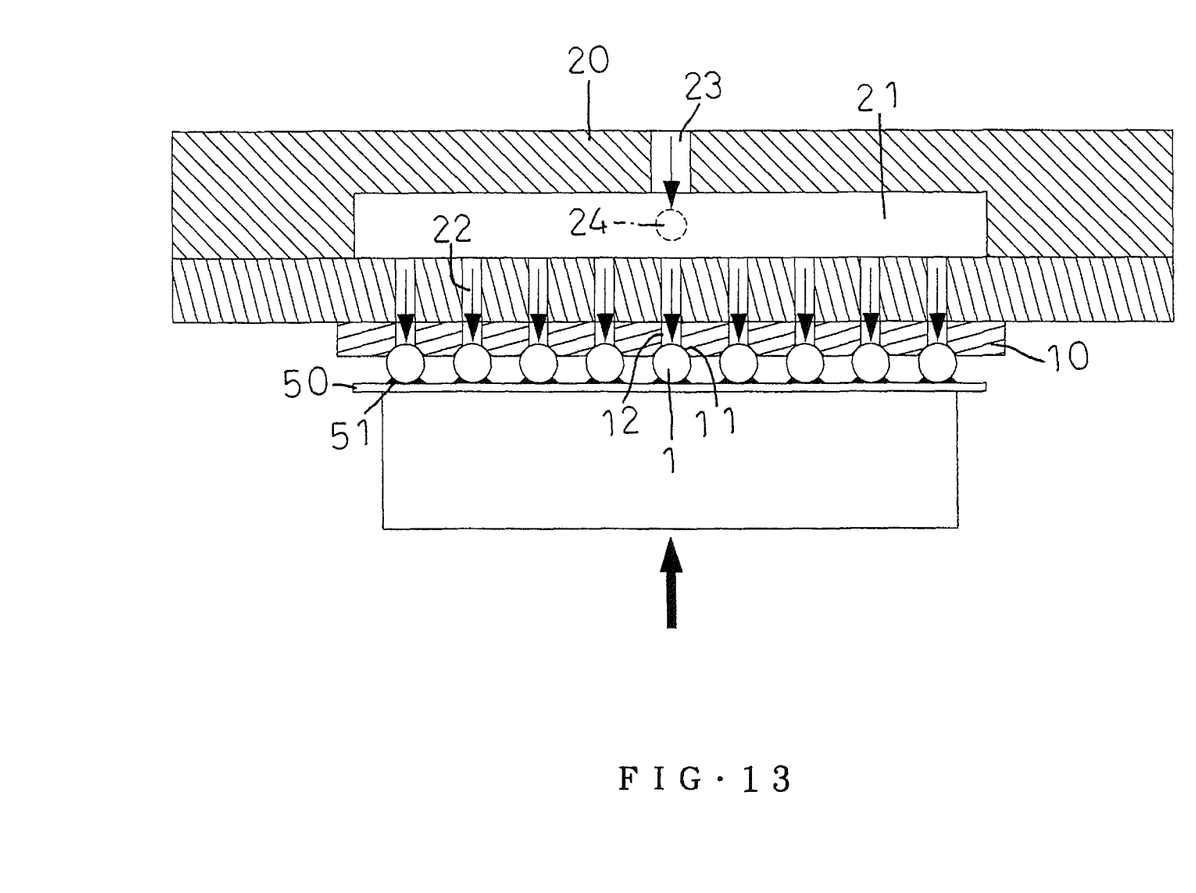
FIG. 13 is a cross sectional view showing the operation of step K of the method for placing and mounting solder balls on an integrated circuit substrate according to the preferred embodiment of the present invention.
Figure 14:
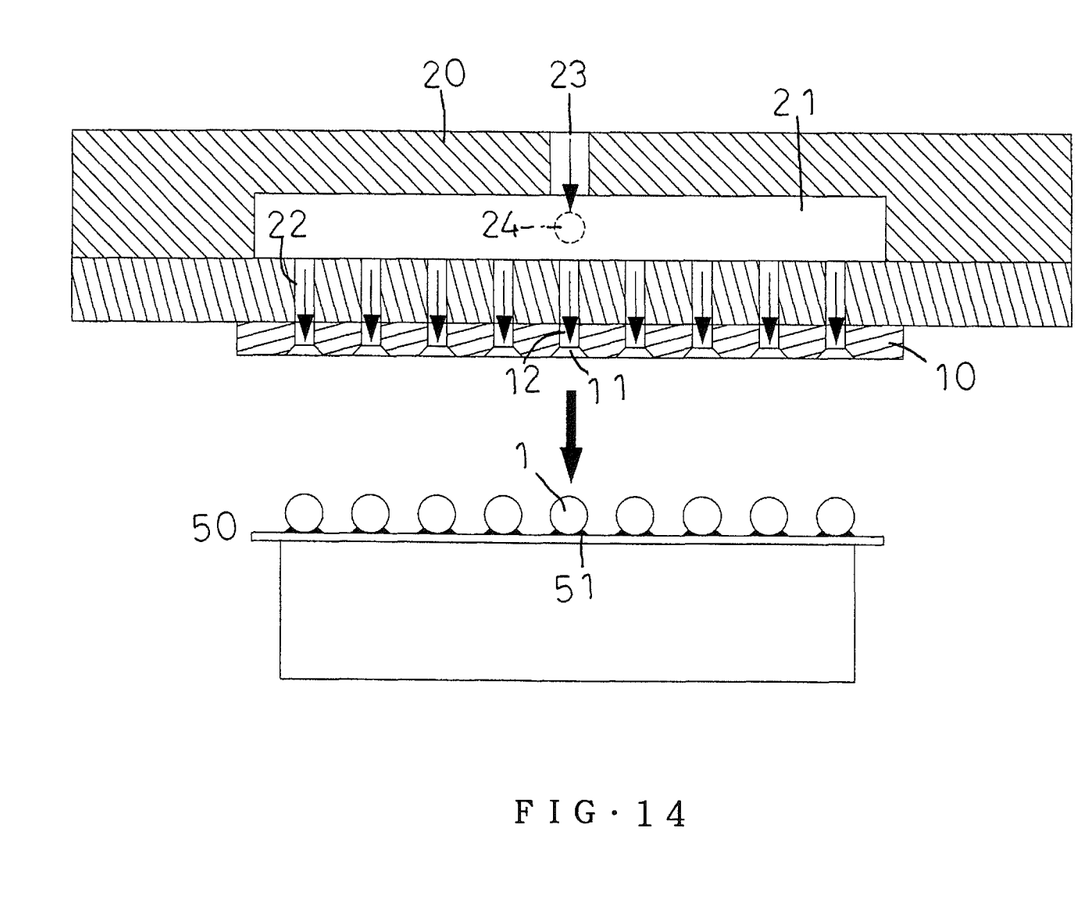
FIG. 14 is a cross sectional view showing the operation of step L of the method for placing and mounting solder balls on an integrated circuit substrate according to the preferred embodiment of the present invention.

A method for placing and mounting solder balls on an integrated circuit substrate according to a preferred embodiment of the present invention comprises steps of:

A. lifting a guiding plate 30 and a storage tank 40 upwardly to connect with a fixture 10 (as shown in FIG. 2);

B. rotating a turning assembly 24 counterclockwisely, after the guiding plate 30 and the storage tank 40 are connected with the fixture 10 (as illustrated in FIG. 3);

C. drawing air out of the vacuum chamber 21 via an air pore 23 by means of a vacuuming device 20 so as to attach a plurality of solder balls 1, when the turning assembly 24 rotates counterclockwisely (as shown in FIG. 4), wherein after the turning assembly 24 rotates counterclockwisely over 180 degrees, the plurality of solder balls 1 in the storage tank 40 move leftward (as illustrated in FIG. 5);

D. rotating the turning assembly 24 clockwisely after the plurality of solder balls 1 in the storage tank 40 move leftward (as shown in FIG. 6);

E. moving the plurality of solder balls 1 in storage tank 40 rightward after the turning assembly 24 rotates clockwisely over 180 degrees (as illustrated in FIG. 7);

F. placing the plurality of solder balls 1 into a plurality of apertures 31 of the guiding plate 30 from the storage tank 40 again and rotating the storage tank 40, the guiding plate 30, the vacuuming device 20, and the fixture 10 back to an original angle (as shown in FIG. 8);

G. moving the guiding plate 30 and the storage tank 40 downwardly so that the guiding plate 30 and the storage tank 40 disconnect from the fixture 10 (as illustrated in FIG. 9);

H. horizontally moving the guiding plate 30 and the storage 40 to one side (as illustrated in FIG. 10);

I. lifting a substrate 50 (as shown in FIG. 11);

J. starting to mount the plurality of solder balls 1 (as illustrated in FIG. 12);

K. re-feeding air into the vacuum chamber 21 from the air pore 23 of the vacuuming device 20 so as to release the plurality of solder balls 1 onto a flux 51 of the substrate 50 from the fixture 10 (as shown in FIG. 13);

L. descending the substrate 50 on which the plurality of solder balls 1 are mounted (as illustrated in FIG. 14).

Thereby, a production yield of placing and mounting the plurality of solder balls on an integrated circuit substrate is enhanced.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A method for placing and mounting solder balls on an integrated circuit substrate comprises steps of:

A. lifting a guiding plate and a storage tank upwardly to connect with a fixture;

B. rotating a turning assembly counterclockwisely, after the guiding plate and the storage tank are connected with the fixture;

C. drawing air out of a vacuum chamber via an air pore by means of a vacuuming device so as to attach a plurality of solder balls 1, when the turning assembly rotates counterclockwisely, wherein after the turning assembly rotates counterclockwisely over 180 degrees, the plurality of solder balls in the storage tank move leftward;

D. rotating the turning assembly clockwisely after the plurality of solder balls in the storage tank move leftward;

E. moving the plurality of solder balls in storage tank rightward after the turning assembly rotates clockwisely over 180 degrees;

F. placing the plurality of solder balls into a plurality of apertures of the guiding plate from the storage tank again and rotating the storage tank, the guiding plate, the vacuuming device, and the fixture back to an original angle;

G. moving the guiding plate and the storage tank downwardly so that the guiding plate and the storage tank disconnect from the fixture;

H. horizontally moving the guiding plate and the storage to one side;

I. lifting a substrate;

J. starting to mount the plurality of solder balls;

K. re-feeding air into the vacuum chamber from the air pore of the vacuuming device so as to release the plurality of solder balls onto a flux of the substrate from the fixture;

L. descending the substrate on which the plurality of solder balls are mounted.

* * * * *